United States Patent
Smith

(10) Patent No.: US 6,489,640 B1
(45) Date of Patent: Dec. 3, 2002

(54) INTEGRATED CIRCUIT WITH FUSE ELEMENT AND CONTACT PAD

(75) Inventor: Gregory J. Smith, Tucson, AZ (US)

(73) Assignee: National Semiconductor Corporation, Santa Clara, CA (US)

( * ) Notice: Subject to any disclaimer, the term of this patent is extended or adjusted under 35 U.S.C. 154(b) by 54 days.

(21) Appl. No.: 09/684,578

(22) Filed: Oct. 6, 2000

(51) Int. Cl.⁷ .............................................. H01L 27/10
(52) U.S. Cl. ...................................... 257/209; 257/529
(58) Field of Search ................................ 257/209, 529, 257/530

(56) References Cited

U.S. PATENT DOCUMENTS

| | | | |
|---|---|---|---|
| 4,446,534 A | 5/1984 | Smith | 365/96 |
| 4,536,948 A | 8/1985 | Te Velde et al. | 438/601 |
| 4,969,124 A | 11/1990 | Luich et al. | 365/201 |
| 4,980,582 A | 12/1990 | Waller et al. | 326/90 |
| 5,059,555 A | 10/1991 | Iranmanesh et al. | 438/328 |
| 5,144,404 A | 9/1992 | Iranmanesh et al. | 257/477 |
| 5,212,102 A | 5/1993 | Iranmanesh et al. | 438/328 |
| 5,436,496 A | 7/1995 | Jerome et al. | 257/529 |
| 5,523,617 A | 6/1996 | Asanasavest | 257/666 |
| 5,550,399 A | 8/1996 | Okazaki | 257/529 |
| 5,686,762 A * | 11/1997 | Langley | 257/775 |
| 5,747,779 A | 5/1998 | Asanasavest | 219/603 |
| 5,789,794 A | 8/1998 | Froehner | 257/529 |
| 5,827,759 A | 10/1998 | Froehner | 438/132 |
| 6,013,938 A * | 1/2000 | Ueuchi et al. | 257/529 |
| 6,242,790 B1 * | 6/2001 | Tsui et al. | 257/529 |

* cited by examiner

Primary Examiner—Phat X. Cao
(74) Attorney, Agent, or Firm—Merchant & Gould P.C.; John W. Branch

(57) ABSTRACT

An integrated circuit is provided that has a fuse element incorporated in the circuit. The circuit includes a substrate, a layer of metal disposed on the substrate, a plurality of openings formed through the layer of metal wherein the plurality of openings encircle a region of the layer of metal, and a contact pad coupled to the region of the layer of metal wherein the region of the layer of metal and the contact pad form the fuse element. The fuse element has a low resistance and has the advantage that the fuse element isolates multiple nodes within the integrated circuit from an external contact pad without disrupting the connectivity of the internal nodes to each other.

17 Claims, 5 Drawing Sheets

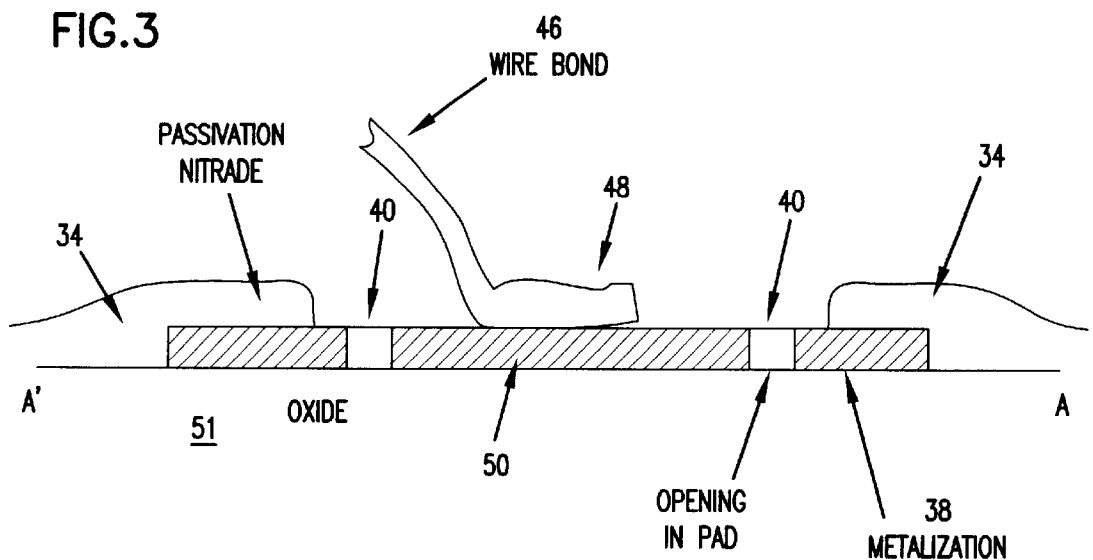
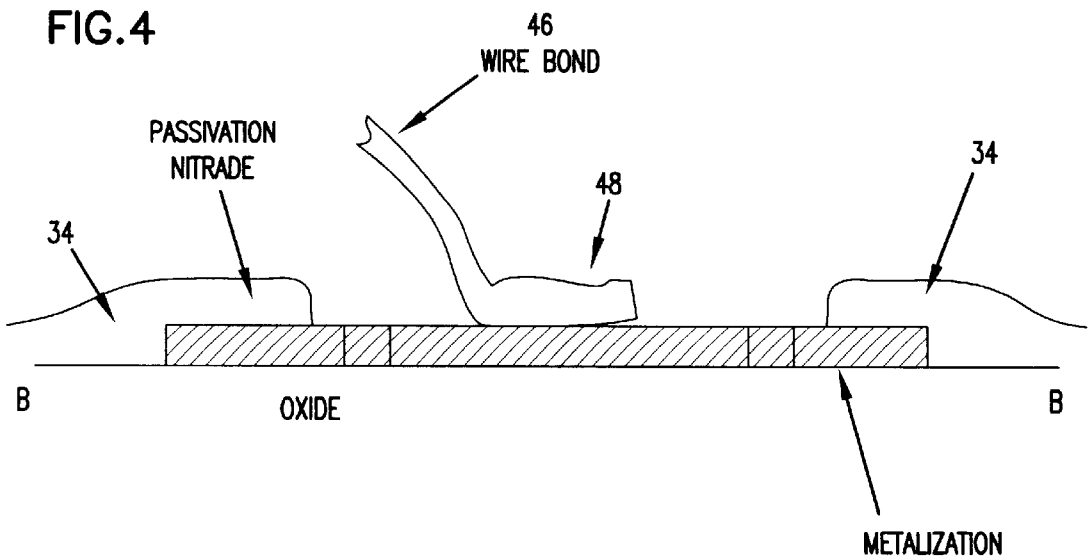

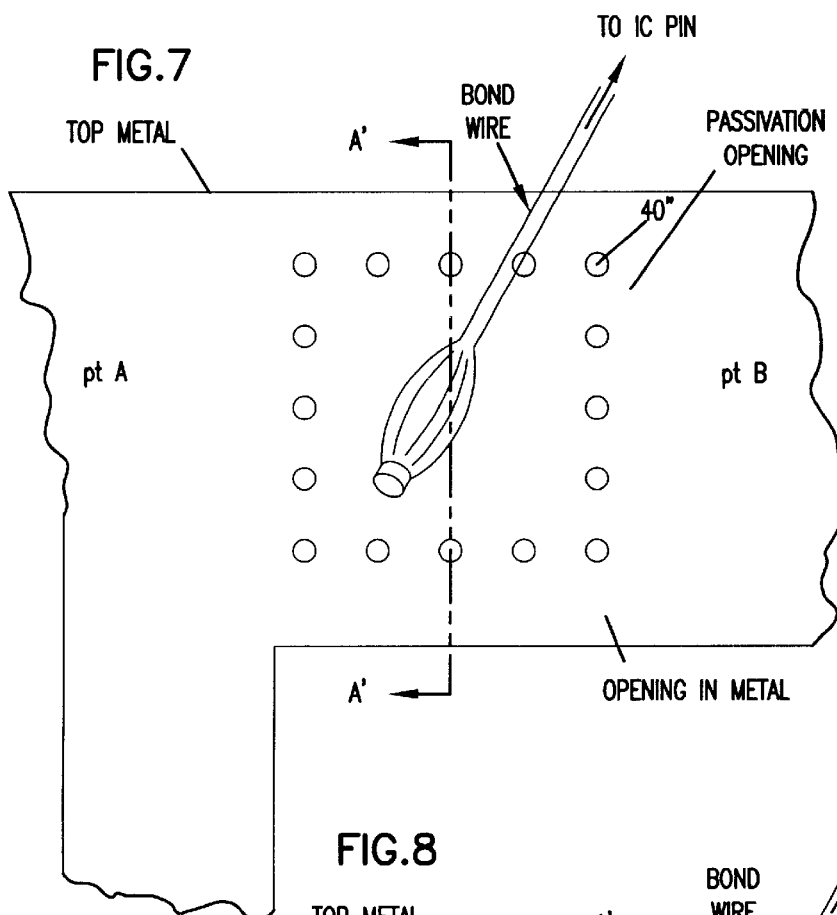
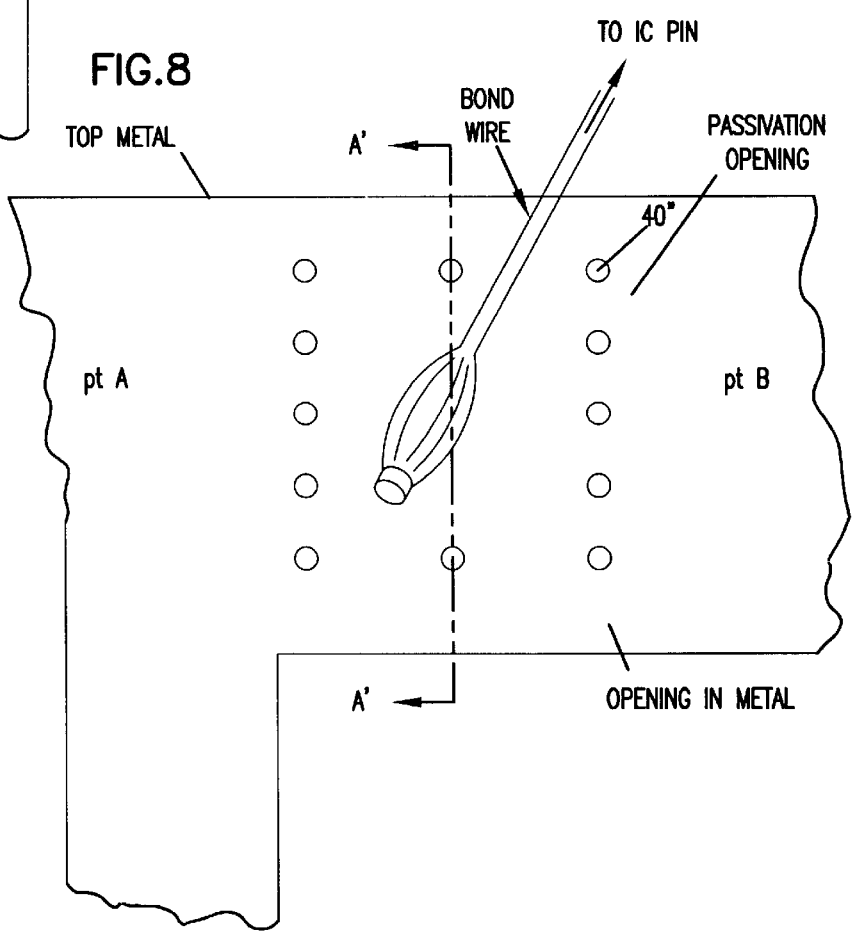

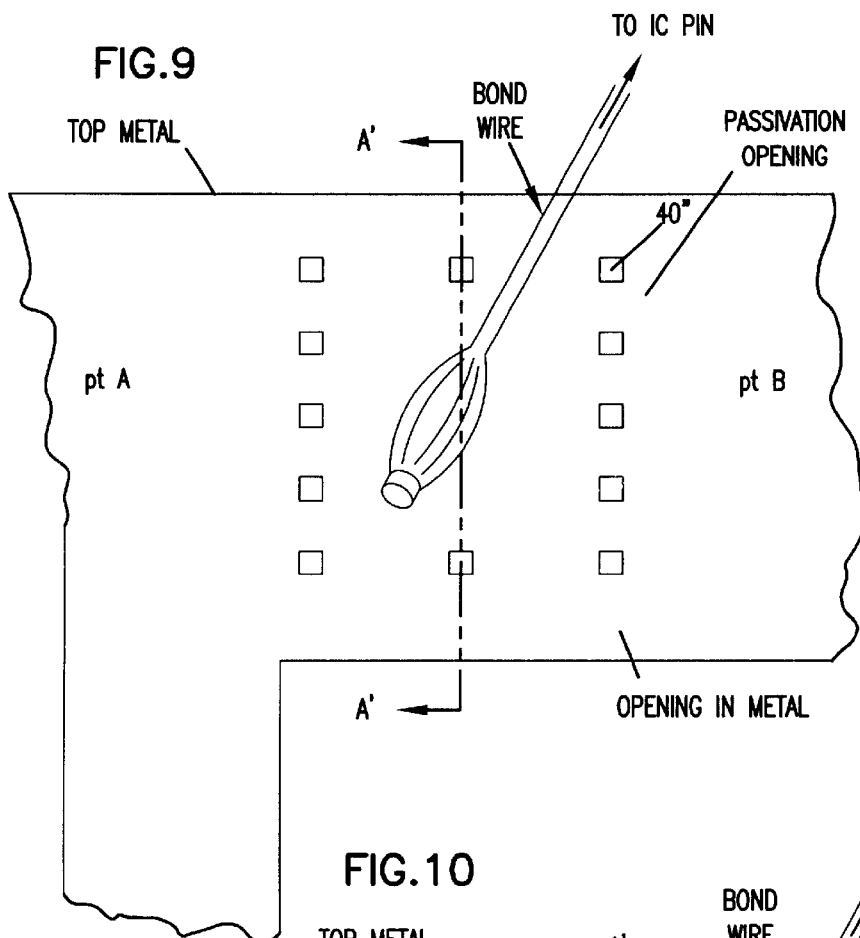
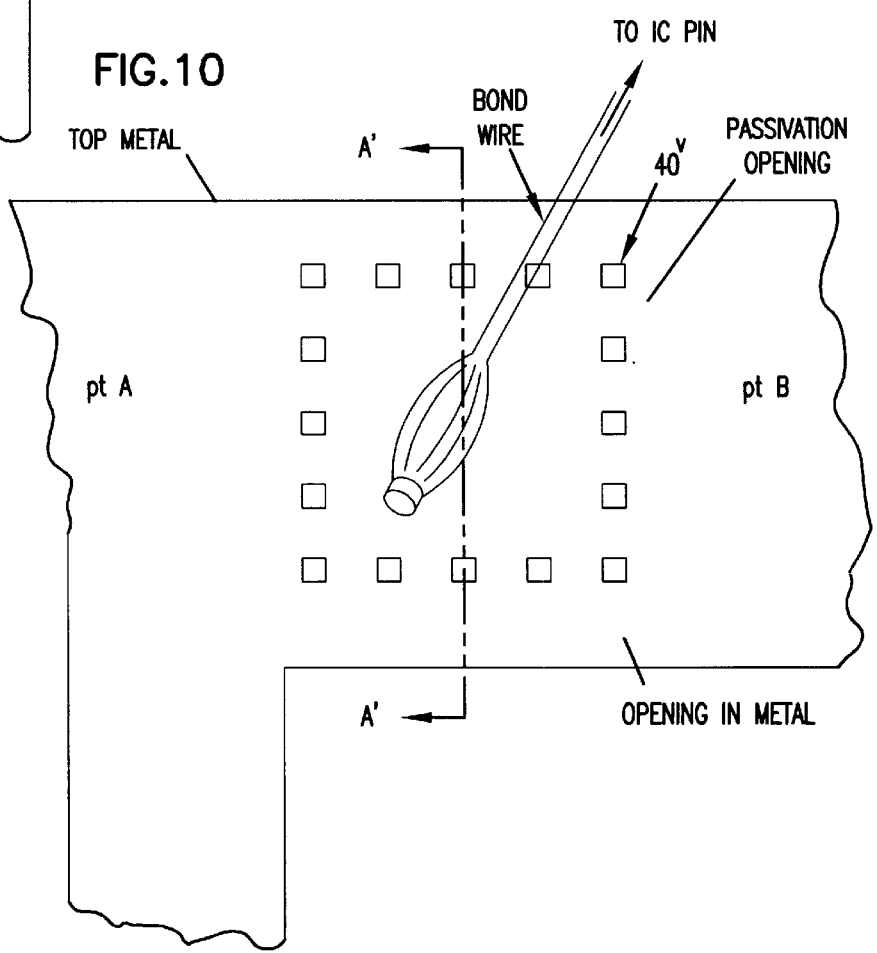

INTEGRATED CIRCUIT WITH FUSE ELEMENT AND CONTACT PAD

FIELD OF THE INVENTION

The present invention relates to a semiconductor integrated circuit and its production having a fuse element that is formed as part of the integrated circuit, and, more particularly, to a fuse element formed as part of the integrated circuit that has a low insertion loss.

BACKGROUND OF THE INVENTION

Fuse elements have been incorporated in semiconductor integrated circuits to enable permanent alteration of a basic circuit design, i.e., to produce the so-called application specific integrated circuits (ASIC's). When left undisturbed, the fuse elements provide conductor paths between certain circuit devices. The fuses may also serve as resistive elements. The fuses can be blown to destroy selected paths of conductivity whereby a circuit function can be permanently altered, i.e., customized. Typically, the fuse elements are burned off (blown) by impinging a high energy laser beam on the fuse.

A disadvantage with known fuse elements incorporated in an integrated circuit is the high insertion loss caused by the fuse element since its resistance is in series with a high current path. The resistance of such known fuse elements is on the order of 200 to 300 milliohms.

It is desirable to provide a fuse element in an integrated circuit that has a low insertion loss. It is desirable to provide a fuse element in an integrated circuit that has a resistance of one order of magnitude less than known fuse elements.

It is also desirable to provide a fuse element that isolates multiple nodes within the integrated circuit from an external contact pad without disrupting the connectivity of the internal nodes to each other.

SUMMARY OF THE INVENTION

In accordance with a first aspect of the invention, there is provided an integrated circuit having a conductive path and a fuse element. The conductive path couples a first point to a second point. The fuse element couples the conductive path to a third point. The fuse element is formed in the conductive path between the first point and the second point. The fuse element is defined by a plurality of openings formed through the conductive path so that when the fuse element blows, the third point is electrically isolated from the conductive path while the first point remains electrically coupled to the second point.

In accordance with a second aspect of the invention, there is provided an integrated circuit for controlling the charging of a battery cell located remotely from the integrated circuit. The integrated circuit includes a first switch, a second switch and a fuse element. The first switch is coupled to a first conductive path and receives first control signals. The second switch is coupled between the first conductive path and a first pin. The fuse is coupled between the first conductive path and a second pin. The second pin can be coupled to a current source that is located remotely from the integrated circuit when the circuit is in use. When the integrated circuit is in use and the battery cell is being charged with current from the current source, the first switch is in an off condition and the second switch is in an on condition to direct current from the current source to the battery cell. When the current exceeds a predetermined level, the fuse blows open thereby isolating the current source from the integrated circuit without interrupting the conductive path.

In accordance with a third aspect of the invention, there is provided an integrated circuit having a fuse element formed therein. The circuit includes a substrate, a layer of metal disposed over the substrate, a plurality of openings formed through the layer of metal that encircle a region of the layer of metal and a contact pad coupled to the region of the layer of metal where the region and contact pad form the fuse element.

In accordance with a fourth aspect of the invention, there is provided a method for making an integrated circuit having a fuse element formed therein. The method includes the steps of disposing a layer of metal on a substrate, forming a plurality of openings through the layer of metal wherein the plurality of openings encircle a region of the layer of metal, and coupling a contact pad to the region of the layer of metal wherein the region of the layer of metal and the contact pad form the fuse element.

A more complete appreciation of the present invention and its improvements can be obtained by reference to the accompanying drawings, which are briefly summarized below, to the following detail description of presently preferred embodiments of the invention, and to the appended claims.

BRIEF DESCRIPTION OF THE DRAWINGS

FIG. 3 is a partial cross-sectional view of a single layer metal integrated circuit shown in FIG. 2 taken along line 3-3'.

FIG. 4 is a partial cross-sectional view of a single layer metal integrated circuit shown in FIG. 2 taken along line 4-4'.

FIGS. 6–10 are partial plan views of integrated circuits according to other preferred embodiments of the present invention.

DETAILED DESCRIPTION OF THE PREFERRED EMBODIMENTS

Figure 1:
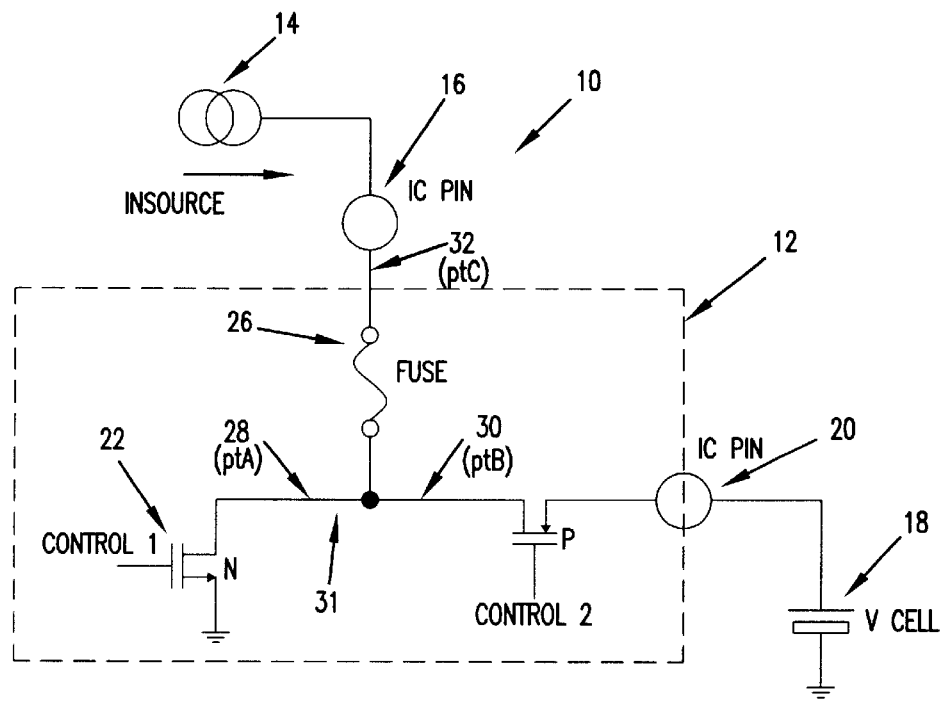
FIG. 1 is an electrical schematic of a circuit utilizing an integrated circuit according to a preferred embodiment of the present invention.

FIG. 1 is an electrical schematic of a circuit 10 utilizing an integrated circuit according to a preferred embodiment of the present invention. The circuit 10 includes an integrated circuit 12 defined by the dashed boundary lines, and elements external to the integrated circuit 12 including a current source 14, and IC pin 16, a battery cell 18 and a second IC pin 20. The integrated circuit 12 itself includes a first transistor 22, a second transistor 24 and a fuse 26. The first transistor 22 is coupled between ground and a point A 28. A gate of the first transistor 22 is coupled to a control signal received from a source internal to the integrated circuit 12. The second transistor 24 is coupled between a point B 30 and IC pin 20. The second transistor's gate is coupled to a second control signal. Points A 28 and B 30 are coupled together to form a conductive path 31. The fuse 26 is coupled between the conductive path 31 and IC pin 16. The current source 14 is coupled to IC pin 16 and the battery cell 18 is coupled between IC pin 20 and ground.

The circuit 10 operates as follows. During normal operation, ie., charging of the battery cell 18, the first transistor 22 is off, the second transistor 24 is on and the fuse 26 is closed. Thus, current travels from the current source 14 to the battery cell 18 thereby charging the cell. When the battery cell 18 has been overly charged and a safety situation exists, a control circuit turns the first transistor 22 on, thereby drawing current to ground. The second control signal causes the second transistor 24 to turn off, thereby isolating the battery cell 18 from the conductive path 31. Current from the current source 14 is thus diverted from the battery cell 18 through the first transistor 22 to ground. If the current from the current source 14 exceeds a predetermined value set by safety standards, fuse 26 blows open, thus isolating the current source 14 from the integrated circuit 12. The conductive path 31 between points A 28 and B 30, however, remains intact. It will be understood that the integrated fuse may be used in other circuits than the one shown in FIG. 1.

Figure 2:
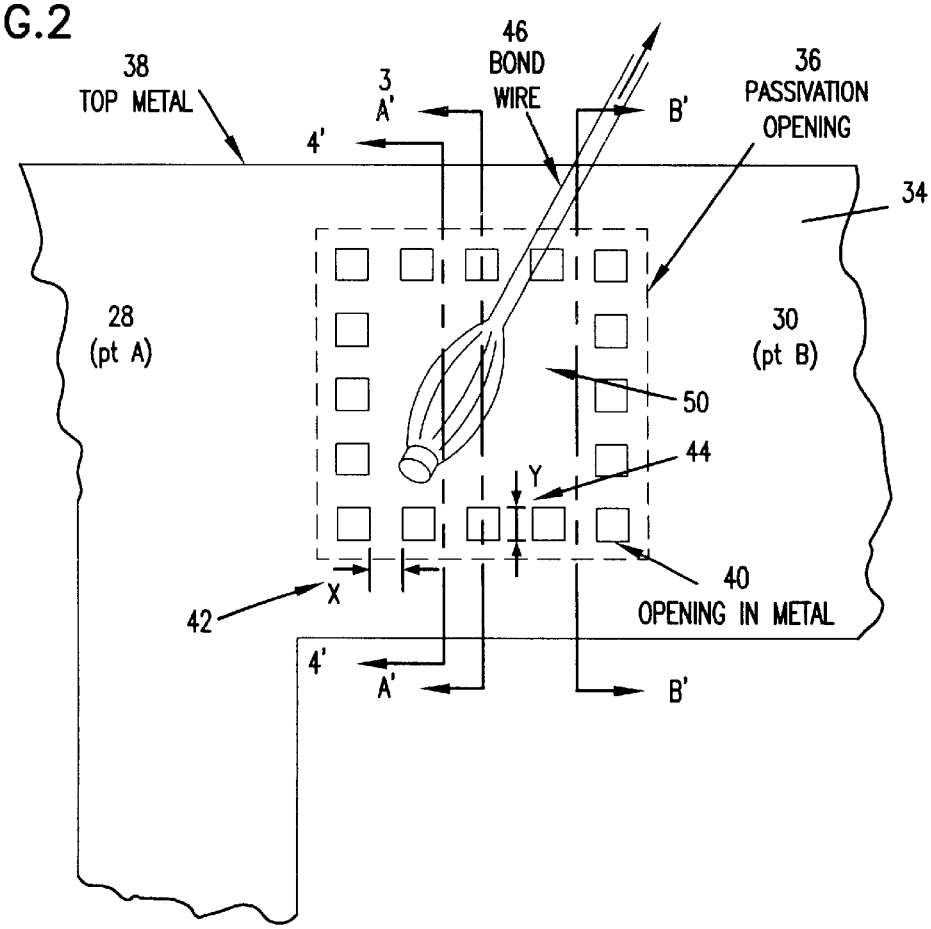
FIG. 2 is a partial plan view of an integrated circuit according to a preferred embodiment of the present invention.

FIG. 2 is a partial plan view of an integrated circuit according to a preferred embodiment of the present invention. The integrated circuit comprises a silicon substrate (not shown). Although not shown, incorporated into the substrate are various doped regions and multiple layers forming a variety of circuit devices. A passivation layer 34 covers most of the integrated circuit. A passivation opening 36 is created in the passivation layer 34 thereby exposing a top metal layer 38 of the integrated circuit. The opening 36 in the passivation layer 34 is preferably square in shape and has a dimension of about 0.1 millimeters to about 0.1 millimeters per side. Of course, the passivation opening 36 may have other shapes as will be described with reference to FIGS. 6–10 and the present invention is not limited to the particular shapes illustrated.

Formed within the top metal layer 38 are a plurality of openings 40 that extend through the metal layer. The plurality of openings 40 encircle an area 50 which will be referred to as a fuse pad area 50 that forms both a portion of the conductive path 31 and the fuse 26 as will be described in detail hereinafter. In this preferred embodiment, each of the plurality of openings is square in shape and has a width and length 44 preferably ranging from about 0.002 millimeters to about 0.02 millimeters. Each opening 40 is spaced from its immediately adjacent opening 40 by a distance 42 preferably by a distance ranging from about 0.002 millimeters to about 0.02 millimeters. Point A 28 is shown to the left of the opening 36 and point B 30 is shown to the right of opening 36. A bond wire 46 is coupled to the fuse pad area 50 at bond 48. Suitable materials for the fuse element, conductive path and contact pad include, but are not limited to, Al, AlCu, AlCuSi, Ti, TiN, W, WSi and TiSi. Suitable materials for the passivation layer are silicon dioxide, nitride and polymers.

FIG. 3 is a partial cross-sectional view of a single layer metal integrated circuit shown in FIG. 2 taken along lines 3–3'. FIG. 4 is a partial cross sectional view of the single layer metal integrated circuit shown in FIG. 2 taken along lines 4–4'. The top layer of metal 38 is formed on an oxide layer 51 which may be disposed on a substrate (not shown) or additional layers (as will be described with reference to FIG. 5). It can be seen from FIG. 3 that the openings 40 extend through the metal layer thereby isolating area 50 from the remaining portion of the top layer 38. The cross-section in FIG. 4 is taken where openings 40 are not formed in the top layer of metal 38. It is these sections that maintain the integrity of the conductive path 31 between points A and B even after the fuse has been blown. It can be seen from FIGS. 3 and 4 that when excessive current flows from the current source through the fuse, the portion of metal underneath the contact pad 48 is burned away thereby disconnecting the wire bond 46 from the integrated circuit. It can be seen that in areas encircled by the plurality of openings 40 that are not in contact with the contact pad 48, the metal layer substantially remains intact, thereby maintaining the conductive path 41 from point A 28 to point B 30.

The plurality of openings 40 reduces the resistance of the fuse element thereby providing the advantage of low insertion loss.

Figure 5:
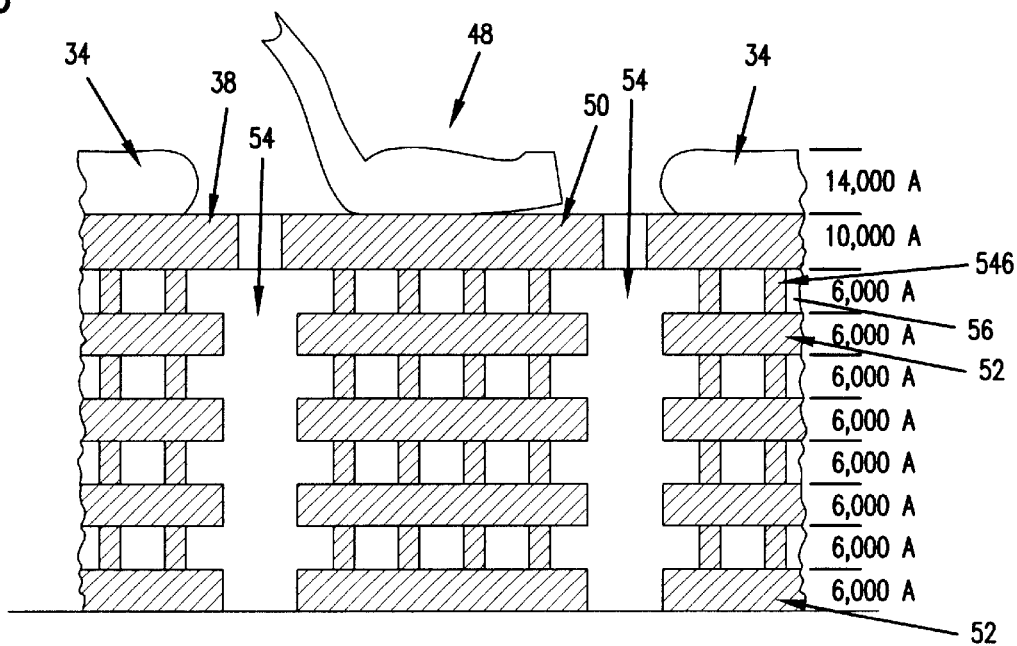
FIG. 5 is a partial plan view of an integrated circuit according to an alternate preferred embodiment of the present invention.
Figure 6:
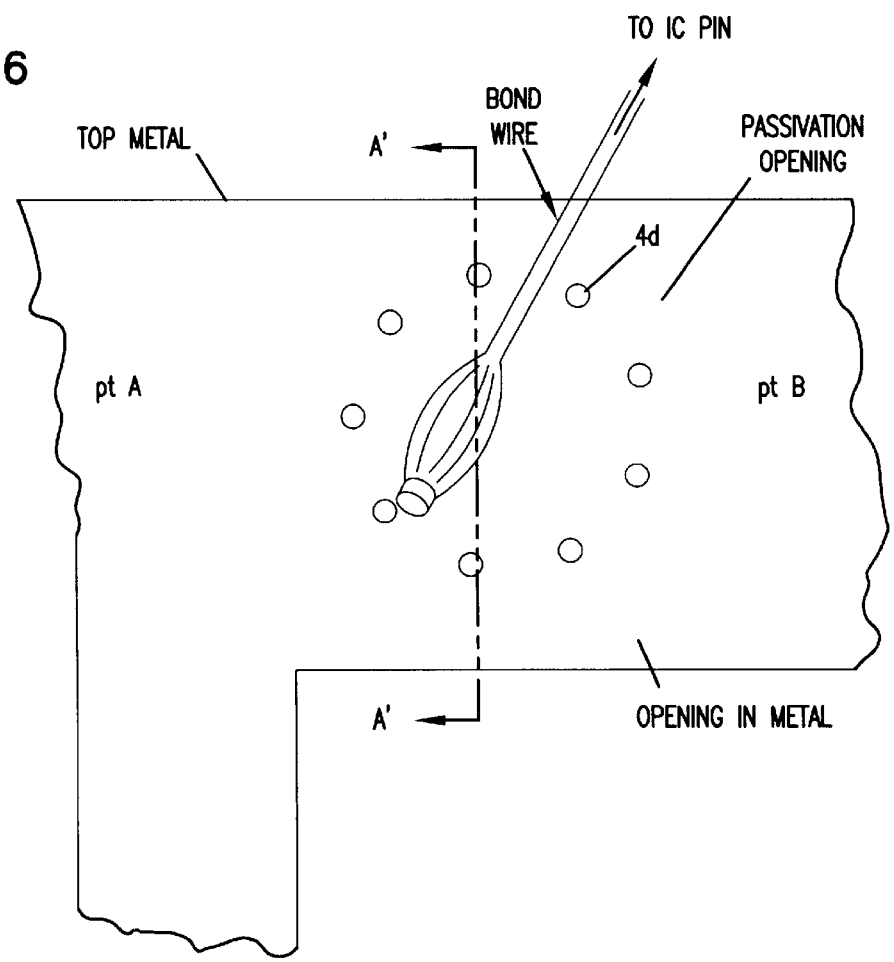

FIG. 5 is a partial plan view of an integrated circuit according to an alternate preferred embodiment of the present invention. The embodiment shown in FIG. 5 is a multi-layered integrated circuit. The top layer of metal 38 is the same as already described with reference to the previous embodiment. In this preferred embodiment, there are four additional metal layers 52 located underneath the top layer 38. Moats 54 are formed between portions of the additional metal layers 52. The moats 54 register with the location of the openings 40 in the top layer 38. The additional layers 52 are coupled to one another and the top layer 38 through metalized cross-layers 56.

In this preferred embodiment, the passivation layer has a thickness that can range from about 3,000 Å to about 20,000 Å and, more preferably, has a thickness of about 14,000 Å, the top layer 38 has a thickness that can range from about 3,000 Å to about 20,000 Å, and, more preferably, has a thickness of about 10,000 Å. The top layer 38 and each additional layer 52 are separated from one another by an oxide layer 56 having a thickness of about 6,000 Å. The additional layers 52 have a thickness of about 6,000 Å. Of course, the various layersmay have other dimensions than those illustrated and the present invention is not limited in this respect.

FIGS. 6–10 are partial plan view of integrated circuits according to other preferred embodiments of the present invention. In the embodiment shown in FIG. 6, the plurality of openings 40' are circular in shape and they form a circular pattern around the contact pad 38. In the embodiment shown in FIG. 7, the plurality of openings 40" are circular in shape and they form a square around the contact pad 38. The embodiment shown in FIG. 8 is similar to that shown in FIG. 7 except the plurality of openings 40" form a rectangle around the contact pad. In the embodiment shown in FIG. 9, the plurality of openings 40$^{IV}$ are square in shape and they form a rectangle around the contact pad 38. In the embodiment shown in FIG. 10, the plurality of openings 40$^V$ are rectangular in shape and they form a rectangle around the contact pad 38. Alternately, the plurality of openings could be rectangular in shape and form a square around the contact pad 38.

By placing the fuse in the integrated circuit, great savings in expense and area are achieved in the total circuit. The configurations of the fuse according to the various preferred embodiments provide a low resistance. In the embodiment shown in FIG. 2, the resistance of the fuse is $(N \cdot y)/(X \cdot \rho_{smetal})$, where N is the number of the plurality of openings, y is the length of the side of each opening, x is the spacing between adjacent openings, $\rho_{smetal}$ is the conductivity of the particular metal used.

Thus, the benefits of the fuse structure according to the various preferred embodiments are its low insertion loss and small footprint. In addition, the integrity of the conductive path between points A and B is maintained.

It is possible that the fuse could blow at different current levels depending if the passivation layer covers the fusing area. Similarly, the plastic package molding material that covers the open pad acts in the same way as the passivation layer in containing the fusing material, so it may make no difference if the fuse is or is not covered by the passivation layer and the present invention is not limited in this sense.

The above specification, examples and data provide a complete description of the manufacture and use of the invention. Since many embodiments of the invention can be made without departing from the spirit and scope of the invention, the invention resides in the claims hereinafter appended.

What is claimed is:

1. An integrated circuit comprising:
   a conductive path coupling a first point to a second point; and
   a fuse element formed in the conductive path between the first point and the second point wherein the fuse element couples the conductive path to a third point and the fuse element is defined by a plurality of openings formed through the conductive path so that when the fuse element blows, the third point is electrically isolated from the conductive path while the first point remains electrically coupled to the second point wherein the plurality of openings are arranged in a square pattern.

2. The integrated circuit of claim 1 wherein the fuse element and conductive path lie in a common plane.

3. The integrated circuit of claim 1 wherein the fuse element and conductive path are formed of the same metal material.

4. The integrated circuit of claim 3 wherein the metal material is one of Al, AlCu, AlCuSi, Ti, TiN, W, WSi and TiSi.

5. The integrated circuit of claim 1 wherein each of the plurality of openings is square in shape.

6. The integrated circuit of claim 1 wherein each of the plurality of openings is rectangular in shape.

7. The integrated circuit of claim 1 wherein each of the plurality of openings is circular in shape.

8. The integrated circuit of claim 5 wherein the square has a width ranging from about 0.002 millimeters to about 0.02 millimeters.

9. The integrated circuit of claim 8 wherein each square is separated from an adjacent square by a distance ranging from about 0.002 millimeters to about 0.02 millimeters.

10. The integrated circuit of claim 1 further comprising a passivation layer wherein the passivation layer is formed of silicon dioxide, nitride, or polymer.

11. The integrated circuit of claim 3 wherein the metal material has a thickness ranging from about 3,000 Å to about 20,000 Å.

12. The integrated circuit of claim 1 further comprising a passivation layer wherein the passivation layer has a thickness ranging from about 3,000 Å to about 20,000 Å.

13. The integrated circuit of claim 1 further comprising a bond wire having a proximal end and a distal end wherein the proximal end is coupled to the fuse element and the distal end is coupled to a pin on the integrated circuit.

14. An integrated circuit comprising:
   a conductive path coupling a first point to a second point; and a fuse element formed in the conductive path between the first point and the second point wherein the fuse element couples the conductive path to a third point and the fuse element is defined by a plurality of openings formed through the conductive path so that when the fuse element blows, the third point is electrically isolated from the conductive path while the first point remains electrically coupled to the second point wherein the plurality of openings are arranged in a circular pattern.

15. An integrated circuit for controlling the charging of a battery cell located remotely from the integrated circuit, the integrated circuit comprising:
   a first switch coupled to a first conductive path, the first switch receiving first control signals;
   a second switch coupled between the first conductive path and a first pin; and
   a fuse coupled between the first conductive path and a second pin wherein the second pin is coupled to a current source located remotely from the integrated circuit when the integrated circuit is in use,
   wherein when the integrated circuit is in use and the battery cell is being charged with current from the current source, the first switch is in an off condition and the second switch is in an on condition to direct the current from the current source to the battery cell and, when the current exceeds a predetermined level, the fuse blows open thereby isolating the current source from the integrated circuit without interrupting the conductive path.

16. The integrated circuit of claim 15 wherein when the battery cell has been fully charged but before the predetermined level has been exceeded, the first switch is turned on and the second switch is turned off so that current from the current source is diverted from the cell.

17. The integrated circuit of claim 15 wherein the fuse is defined by a plurality of openings formed through the conductive path.

* * * * *